United States Patent
Fujikura et al.

(10) Patent No.: US 8,310,029 B2
(45) Date of Patent: Nov. 13, 2012

(54) GROUP III NITRIDE SEMICONDUCTOR FREE-STANDING SUBSTRATE AND METHOD OF MANUFACTURING THE SAME, GROUP III NITRIDE SEMICONDUCTOR DEVICE AND METHOD OF MANUFACTURING THE SAME

(75) Inventors: Hajime Fujikura, Mito (JP); Takeshi Eri, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 197 days.

(21) Appl. No.: 12/801,214

(22) Filed: May 27, 2010

(65) Prior Publication Data

US 2011/0006397 A1  Jan. 13, 2011

(30) Foreign Application Priority Data

Jul. 8, 2009  (JP) ................. 2009-161375

(51) Int. Cl.
*H01L 29/20* (2006.01)
(52) U.S. Cl. ................. 257/615; 257/E29.089
(58) Field of Classification Search .......... 257/615, 257/E29.089
See application file for complete search history.

(56) References Cited

U.S. PATENT DOCUMENTS

2007/0176199 A1   8/2007  Shibata
2008/0283851 A1*  11/2008  Akita ..................... 257/94

FOREIGN PATENT DOCUMENTS

JP   2007-197276   8/2007

OTHER PUBLICATIONS

Yuichi Oshima et al., "Preparation of Freestanding GaN Wafers by Hydride Vapor Phase Epitaxy with Void-Assisted Separation", Japanese Journal of Applied Physics vol. 42 (2003) pp. L1-L3).
Kensaku Motoki et al., "Dislocation reduction in GaN crystal by advanced-DEEP", Journal of Crystal Growth vol. 305 (2007) pp. 377-383.

* cited by examiner

*Primary Examiner* — Cuong Q Nguyen
*Assistant Examiner* — Tran Tran
(74) *Attorney, Agent, or Firm* — McGinn IP Law Group, PLLC

(57) ABSTRACT

A group III nitride semiconductor free-standing substrate includes an as-grown surface, more than half of a region of the as-grown surface including a single crystal plane. The single crystal plane includes an off-angle inclined in an m-axis or a-axis direction from a C-plane with a group III polarity, or in a c-axis or a-axis direction from an M-plane.

11 Claims, 13 Drawing Sheets

GROUP III NITRIDE SEMICONDUCTOR FREE-STANDING SUBSTRATE AND METHOD OF MANUFACTURING THE SAME, GROUP III NITRIDE SEMICONDUCTOR DEVICE AND METHOD OF MANUFACTURING THE SAME

The present application is based on Japanese Patent Application No. 2009-161375 filed on Jul. 8, 2009, the entire contents of which are incorporated herein by reference.

BACKGROUND OF THE INVENTION

1. Field of the Invention

The invention relates to a group III nitride semiconductor free-standing substrate used for crystal growth of light-emitting devices such as a light-emitting diode (LED) and a laser diode (LD) or electronic devices such as a high electron mobility transfer (HEMT), a method of manufacturing the same, a group III nitride semiconductor device having a group III nitride semiconductor layer grown on the substrate, and a method of manufacturing the same.

2. Description of the Related Art

A group III nitride semiconductor attracts attention as a material for light-emitting devices of green, blue or ultraviolet light, etc., as well as a material for electronic devices mainly used for high output. Conventionally, most of the group III nitride semiconductors, of which application as a device has been reported, are grown on a heterogeneous substrate such as sapphire or 4H-SiC via a low temperature GaN or AlN buffer layer or a high temperature AlN buffer layer. However, when the group III nitride semiconductor layer is grown on the heterogeneous substrates, high density dislocation is introduced into the group III nitride semiconductor layer due to a difference in a lattice constant or a thermal expansion coefficient between the heterogeneous substrate and the group III nitride semiconductor layer. Since the dislocation in the group III nitride semiconductor layer acts as a non-light emitting recombination center or a diffusion path of impurity, the problem arises in that desired characteristics are not obtained or that the characteristics deteriorate quickly in a device made of the group III nitride semiconductor with high density dislocation.

When a free-standing single crystal substrate formed of the group III nitride semiconductor is used, it is possible to avoid the above-mentioned problem which is caused by lattice mismatch or thermal expansion coefficient mismatch, and thus, a blue-violet LD and a blue LD, etc., in which a group III nitride semiconductor layer is formed using a GaN free-standing substrate, are practically used. Currently, the most widely used method of manufacturing a group III nitride semiconductor free-standing substrate is a method in which a group III nitride semiconductor layer having a thickness from several hundreds μm to several cm is grown on a seed crystal substrate formed of a crystal different from the group III nitride semiconductor, such as sapphire, SiC, GaAs or Si, using a metal organic vapor phase epitaxial method (MOVPE method), a hydride vapor phase epitaxy method (HVPE method) or ammonothermal synthesis, etc. However, when the group III nitride semiconductor free-standing substrate manufactured by the currently common method is used, there is a problem that characteristics of the obtained device are largely different depending on a position within a substrate surface.

A method of manufacturing this type of group III nitride semiconductor free-standing substrate is known in which Ti is deposited on a surface of a GaN thin film on a sapphire substrate of which surface is a C-plane and is then heat-treated to form a void structure in GaN, several hundreds μm thick GaN of which surface is a C-plane is grown thereon by the HVPE method and the sapphire substrate side from the void structure is separated (Void-Assisted Separation: VAS method) (e.g., see the non-patent literary document of Yuichi OSHIMA et al. Japanese Journal of Applied Physics Vol. 42 (2003) pp. L1-L3). In addition, another manufacturing method is known in which several hundreds μm thick GaN is grown on GaAs substrate (cubic crystal) of which surface is a (111) plane with a $SiO_2$ mask having openings formed thereon, and the GaAs substrate is subsequently removed (e.g., see the non-patent literary document of Kensaku Motoki et al. Journal of Crystal Growth Vol. 305 (2007) 377-383).

Since the above methods are the crystal growth of the group III nitride semiconductor on the heterogeneous substrate, a crystal in contact with the heterogeneous substrate at the initial growth stage has very high dislocation density. The typical dislocation density at the initial growth stage is on the order of $10^9$-$10^{10}$/cm$^2$. In accordance with progress of crystal growth, the dislocation density gradually decreases and the dislocation density on the surface after several hundreds μm thick growth is on the order of $10^6$/cm$^2$ which is a level capable of manufacturing a LD. The crystal growth is completed after the dislocation density on the surface is sufficiently decreased as described above, the seed crystal is removed and the thickness is subsequently uniformed by polishing front and back surfaces of the substrate, then, the outer shape is trimmed if needed, thereby manufacturing the group III nitride semiconductor free-standing substrate.

In the group III nitride semiconductor free-standing substrate obtained as described above, the dislocation density gradually varies along a thickness direction of the substrate. Strain is generated inside the substrate due to the variation of the dislocation density in a depth direction, which causes that crystal orientations are different in a plane of the surface of the free-standing substrate as shown in FIG. 12 due to the influence thereof. Here, FIG. 12 is a schematic view of a group III nitride semiconductor free-standing substrate, showing a state that an angle formed by a predetermined crystal axis (e.g., a c-axis) and a surface continuously varies in a substrate surface. As shown in FIG. 12, a relation among an angle θ1 formed on one side of a free-standing substrate 850, an angle θ2 formed in the middle of the substrate and an angle θ3 formed on another side of the substrate is θ1<θ2<θ3. Since step density on the substrate surface is different when the angle formed by the surface of the substrate and the crystal axis is different, growth characteristics such as a thickness, a doping concentration and a mixed crystal composition, etc., in the group III nitride semiconductor layer grown on the surface are also different. This causes the above-mentioned large difference in the obtained device characteristics depending on a position in the substrate surface.

A group III nitride semiconductor free-standing substrate 950 in which the crystal orientations on the surface are uniformed by spherically polishing the substrate surface as shown in FIG. 13 may be realized in order to solve the above problem. However, since the group III nitride semiconductor is hard, it is difficult to perform the spherical polishing with good reproducibility and good accuracy.

A method of obtaining a free-standing substrate without performing the spherical polishing is proposed in which a sapphire substrate with a surface inclined at 0.07°-20° in an a-axis or m-axis direction from a C-plane is used, a nitride-based semiconductor single crystal epitaxial layer is grown on the substrate and the epitaxial layer is subsequently removed from a heterogeneous substrate, thereby obtaining a nitride-based semiconductor free-standing substrate having a desired off-angle (e.g., see JP-A 2007-197276).

SUMMARY OF THE INVENTION

However, since plural crystal planes caused by plural facets appear on a surface of the group III nitride semiconductor free-standing substrate in the method described in JP-A 2007-197276, a composition of the group III nitride semiconductor layer grown on the free-standing substrate may be non-uniform.

Therefore, it is an object of the invention to provide a group III nitride semiconductor free-standing substrate in which an area of a single crystal plane on a surface can be enlarged with good reproducibility without performing the spherical polishing, etc., a method of manufacturing the same, a group III nitride semiconductor device using the free-standing substrate, and a method of manufacturing the same.

(1) According to one embodiment of the invention, a group III nitride semiconductor free-standing substrate comprises:

an as-grown surface, more than half of a region of the as-grown surface comprising a single crystal plane, wherein said single crystal plane comprises an off-angle inclined in an m-axis or a-axis direction from a C-plane with a group III polarity, or in a c-axis or a-axis direction from an M-plane.

(2) According to another embodiment of the invention, a group III nitride semiconductor device comprises a group III nitride semiconductor layer on the group III nitride semiconductor free-standing substrate according to the above embodiment (1).

(3) According to another embodiment of the invention, a method of manufacturing a group III nitride semiconductor free-standing substrate comprises:

forming a group III nitride semiconductor on a surface of a seed crystal substrate using a vapor-phase growth method; and subsequently removing the seed crystal substrate from the group III nitride semiconductor, wherein the seed crystal substrate comprises a hexagonal or cubic crystal structure, the surface of the seed crystal substrate is inclined in an m-axis or a-axis direction from a C-plane or in a c-axis or a-axis direction from an M-plane in a range of not less than 0.35° and not more than 0.8° in the hexagonal crystal, and is inclined in a [211] or [110] direction from a (111) plane in a range of not less than 0.35° and not more than 0.8° in the cubic crystal; and the group III nitride semiconductor is grown under a condition such that a growth rate does not linearly vary with respect to variation in a supply amount of a group III raw material.

(4) According to another embodiment of the invention, a method of manufacturing a group III nitride semiconductor device comprises:

manufacturing a group III nitride semiconductor free-standing substrate by the manufacturing method according to the above embodiment (3); and forming a group III nitride semiconductor layer on the group III nitride semiconductor free-standing substrate by epitaxial growth.

(5) According to another embodiment of the invention, a group III nitride semiconductor device manufactured by the manufacturing method according to the above embodiment (3) comprises:

an as-grown surface, more than half of a region of the as-grown surface comprising a single crystal plane, wherein said single crystal plane comprises an off-angle inclined in an m-axis or a-axis direction from a C-plane with a group III polarity, or in a c-axis or a-axis direction from an M-plane.

Points of the Invention

According to one embodiment of the invention, the surface of a sapphire substrate for growing a group III nitride semiconductor thereon is inclined in the a-axis direction from the C-plane in the range of not less than 0.35° and not more than 0.8° and is grown in the range that the growth rate of the group III nitride semiconductor does not linearly vary with respect to the variation in the supply amount of the group III raw material, the surface condition drastically changes and the area of a first facet is largely enlarged, so that more than half of the region of the surface of the free-standing substrate is covered by a single crystal plane. For example, when GaN is grown on the sapphire substrate with a crystal plane close to the C-plane on the surface thereof, since the GaN grows such that the a-axis of the sapphire substrate coincides with the m-axis of the GaN, the GaN will have a surface inclined in the m-axis direction from the C-plane.

BRIEF DESCRIPTION OF THE DRAWINGS

Next, the present invention will be explained in more detail in conjunction with appended drawings, wherein:

FIGS. 1A to 1C are schematic views for explaining a method of manufacturing a nitride semiconductor free-standing substrate in a preferred embodiment of the present invention, wherein FIG. 1A is a view showing a state in which a void structure is formed in a GaN thin film on a sapphire substrate, FIG. 1B is a view showing a state in which GaN is grown by a HVPE method and FIG. 1C is a view showing a state in which the sapphire substrate side from the void structure is removed from GaN;

DETAILED DESCRIPTION OF THE PREFERRED EMBODIMENTS

Summary of the Embodiment

Figure 1A:
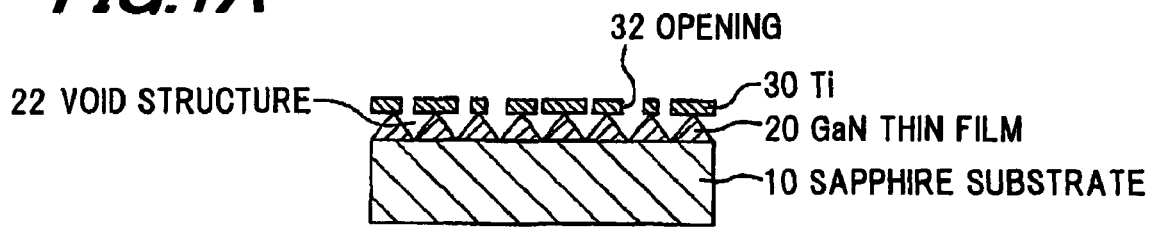

A method of manufacturing a group III nitride semiconductor free-standing substrate, in which a group III nitride semiconductor is formed on a surface of a seed crystal substrate using a vapor-phase growth method and the seed crystal substrate is subsequently removed from the group III nitride semiconductor, is conducted under the conditions that the seed crystal substrate has a hexagonal or cubic crystal structure, the surface of the seed crystal substrate is inclined in an m-axis or a-axis direction from a C-plane or in an a-axis direction from an M-plane in the range of not less than 0.35° and not more than 0.8° in the hexagonal crystal and is inclined in a [211] or [110] direction from a (111) plane in the range of not less than 0.35° and not more than 0.8° in the cubic crystal, and the group III nitride semiconductor is grown so that a growth rate does not linearly vary with respect to variation in a supply amount of a group III raw material. In addition, in a method of manufacturing a group III nitride semiconductor device, a group III nitride semiconductor free-standing substrate is manufactured by the above method of manufacturing the group III nitride semiconductor free-standing substrate and a group III nitride semiconductor layer is formed on the group III nitride semiconductor free-standing substrate by epitaxial growth.

In addition, in the group III nitride semiconductor free-standing substrate obtained by forming the group III nitride semiconductor on the surface of the seed crystal substrate using the vapor-phase growth method and subsequently removing seed crystal substrate from the group III nitride semiconductor, more than half of the region of the surface is formed of a single crystal plane having an off-angle which is inclined in the m-axis or a-axis direction from the C-plane having a group III polarity, or in the c-axis or a-axis direction from the M-plane. Furthermore, in the group III nitride semiconductor device in which the group III nitride semiconductor layer is formed on the group III nitride semiconductor free-standing substrate by epitaxial growth, more than half of the region of the surface of the group III nitride semiconductor free-standing substrate on which the group III nitride semiconductor layer is formed of a single crystal plane having an off-angle which is inclined in the m-axis or a-axis direction from the C-plane having a group III polarity, or in the c-axis or a-axis direction from the M-plane.

Embodiment

Outline of the Free-Standing Substrate

In a group III nitride semiconductor free-standing substrate in the embodiment of the invention, a surface is a mirror surface, at least more than half of the region of the surface of the free-standing substrate is formed of a single crystal plane having an off-angle which is inclined in the m-axis from the C-plane having a group III polarity, and the crystal plane is formed by crystal growth. The above-mentioned off-angle is preferably in the range of not less than 0.4° and not more than 1.0°. Here, the free-standing substrate means a substrate which is capable of maintaining own shape and has a strength such that inconvenience for handling is not caused. The thickness of the free-standing substrate is preferably 250 μm or more. In addition, the single crystal plane means a plane having uniform crystal orientations. The group III nitride semiconductor is grown by the vapor-phase growth method in a region in which the growth rate does not linearly vary with respect to the variation in the supply amount of the group III raw material. When the group III nitride semiconductor is GaN, the single crystal plane is inclined in the m-axis direction from the C-plane having a Ga polarity in a predetermined range. GaN, AlN, InN, AlGaN, InGaN or InAlGaN, etc can be used as the group III nitride semiconductor. The "surface" in the present embodiment is a crystal growth surface.

Brief Summary of the Method of Manufacturing the Free-Standing Substrate

The free-standing substrate of the present embodiment is manufactured by, using a seed crystal substrate formed of sapphire having a hexagonal crystal structure, inclining the surface of the seed crystal substrate in the a-axis direction from the C-plane in the range of not less than 0.35° and not more than 0.8° and growing a group III nitride semiconductor on the surface by the vapor-phase growth method in a region in which the growth rate does not linearly vary with respect to the variation in the supply amount of the group III raw material. According to this method, more than half of a region of the surface of the free-standing substrate which is in an as-grown state just after the crystal growth can be covered by the single crystal plane. Therefore, surface polishing after the crystal growth is not required in this manufacturing method. Here, when any of SiC, GaN, AlN, AlGaN, InN and InAlGaN is selected and used as a hexagonal seed crystal substrate instead of using sapphire, a substrate in which a surface thereof has an off-angle inclined in the m-axis from the C-plane in the range of not less than 0.35° and not more than 0.8° is used as the seed crystal substrate.

Specific Example of the Manufacturing Method

Figure 1B:
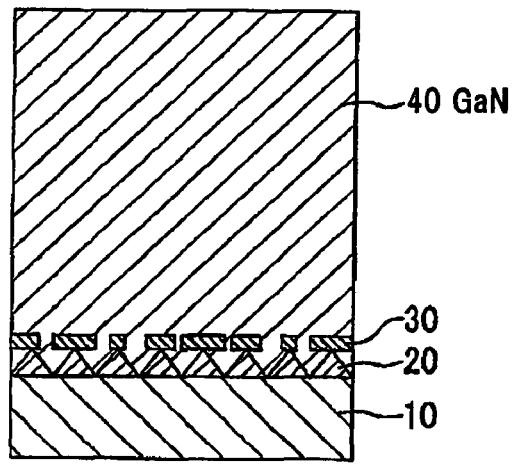
Figure 1C:
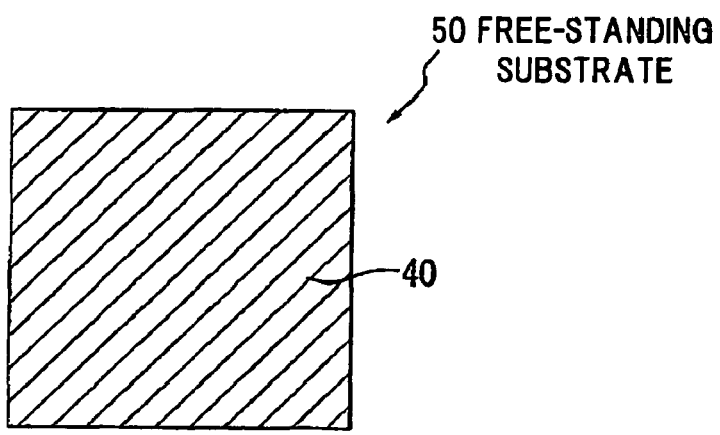

FIGS. 1A to 1C are schematic views for explaining a method of manufacturing a nitride semiconductor free-standing substrate in the embodiment of the invention, wherein FIG. 1A is a view showing a state in which a void structure is formed in a GaN thin film on a sapphire substrate, FIG. 1B is a view showing a state in which GaN is grown by a HVPE method and FIG. 1C is a view showing a state in which the sapphire substrate side from the void structure is removed from GaN.

An example of the manufacturing method using a VAS method will be specifically explained. Firstly, as shown in FIG. 1A, Ti 30 having openings 32 is vapor-deposited on a surface of a GaN thin film 20 on a sapphire substrate 10 having a surface inclined in the a-axis direction from the C-plane in the range of not less than 0.35° and not more than 0.8° and is then heat-treated, thereby forming a void structure 22 on the GaN thin film 20. Next, as shown in FIG. 1B, GaN 40 having a surface close to the C-plane is grown in a thickness of several hundreds μm on the GaN thin film 20 having the void structure 22 and the Ti 30 by the HVPE method. Although the detail of the growth condition of the GaN 40 is described later, a V/III ratio is set so that the growth rate does not exhibit saturated behavior and thus does not linearly vary even the group III raw material supply is increased. Then, as shown in FIG. 1C, the sapphire substrate 10 side from the void structure 22 is removed and a free-standing substrate 50 formed of the GaN 40 is thereby obtained. In the present embodiment, the sapphire substrate 10 is in a circular disc shape and the free-standing substrate 50 is also in a circular disc shape.

Surface Condition of the Free-Standing Substrate 50

Figure 2:
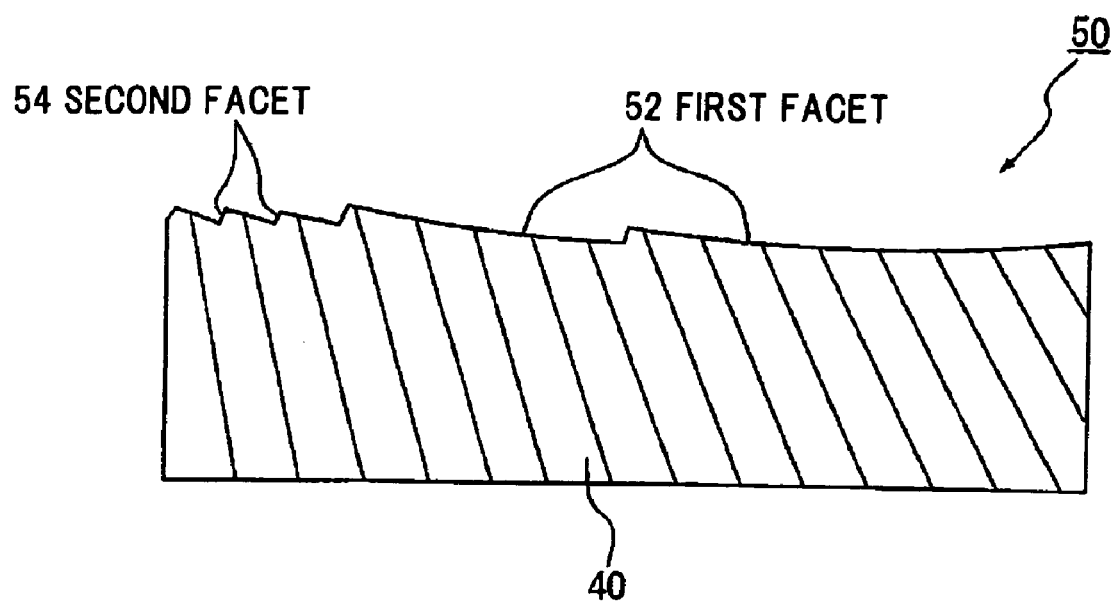
FIG. 2 is a schematic cross sectional view showing a group III nitride semiconductor free-standing substrate in the embodiment of the invention.
Figure 3:
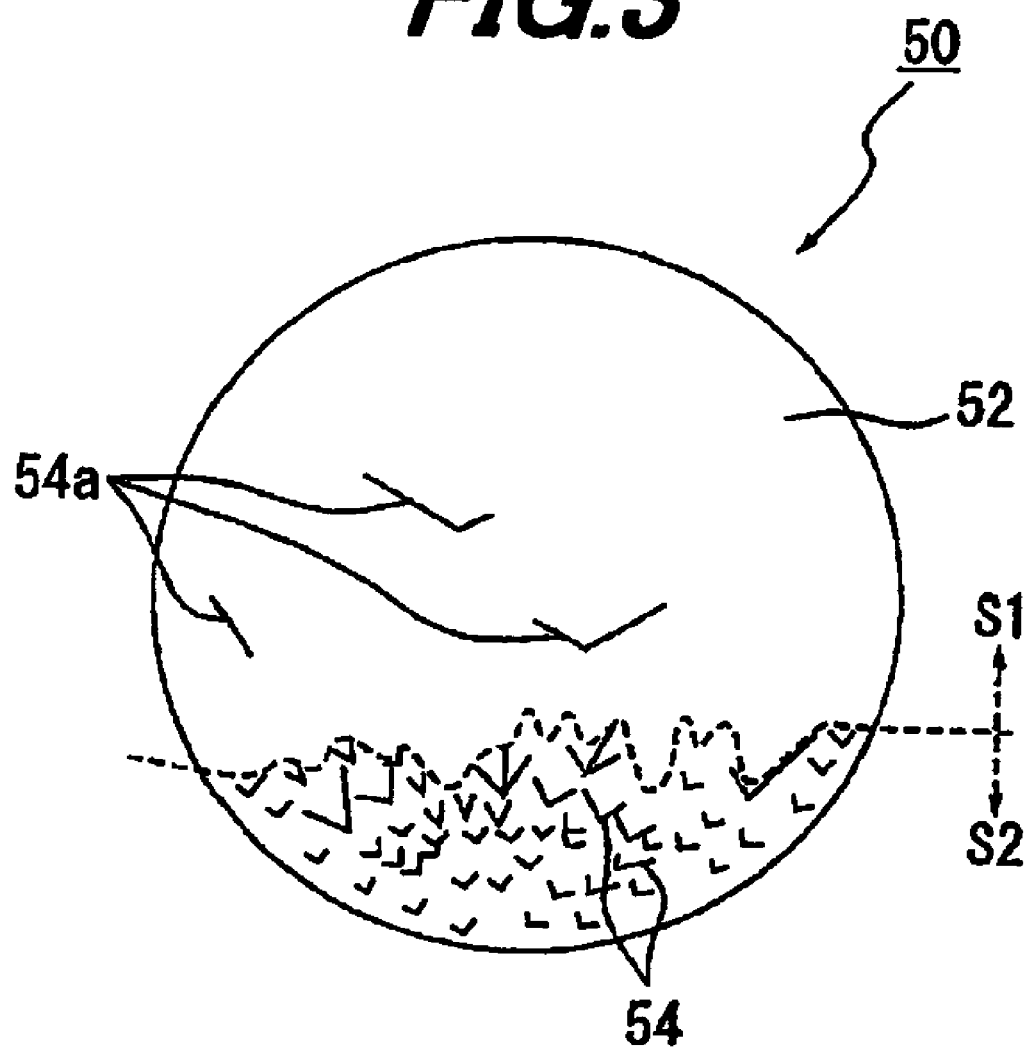
FIG. 3 is a schematic plan view showing a group III nitride semiconductor free-standing substrate in the embodiment of the invention.

FIG. 2 is a schematic cross sectional view showing a group III nitride semiconductor free-standing substrate in the embodiment, and FIG. 3 is a schematic plan view showing a group III nitride semiconductor free-standing substrate in the embodiment.

As shown in FIG. 2, a first facet 52 having relatively large area and a second facet 54 having relatively small area are observed in the free-standing substrate 50 manufactured as described above. A crystal plane of the first facet 52 is curved in accordance with variation in a crystal axis direction, and forms a continuous single wide plane. As shown in FIG. 3, in the present embodiment, the single crystal plane of the first facet 52 includes steps caused by several second facets 54 but covers, as the continuous plane, more than half of the region of the free-standing substrate 50. In FIG. 3, the white portion roughly indicates the first facet 52 and the black line roughly indicates the second facet 54.

As-Grown Substrate Surface

The surface of the free-standing substrate is an as-grown surface. Here, the as-grown surface means a surface in a state that the crystal is just grown without performing any processes such as grinding or polishing thereon. Etching and washing to remove contamination on the surface are not included in the processes here.

It is possible to prevent a production yield of the substrate in the polishing process from decreasing by using the substrate surface in an as-grown state. There is a large difference in characteristics of a C-plane GaN substrate between front and back sides, and a Ga plane as a front surface is harder than an N-plane as a back surface, thus, the polishing rate is not gained. In addition, since it is chemically very stable and it is difficult to etch, a flaw such as a scratch is likely to occur. Thus, if the polishing process of the Ga plane can be omitted, the production yield of the substrate will be improved and the cost will be drastically reduced. Furthermore, since it is difficult to polish the Ga plane as described above, there is a problem that processing strain due to the polishing is likely to remain. If the residual processing strain is present, there is a problem that the morphology on an epi-layer surface is disordered or new crystal defects are generated in the epi-layer when the epi-layer is grown on the substrate. When the substrate is used as-grown, the processing strain does not remain and the aforementioned problem caused by the residual processing strain does not arise.

Figure 4:
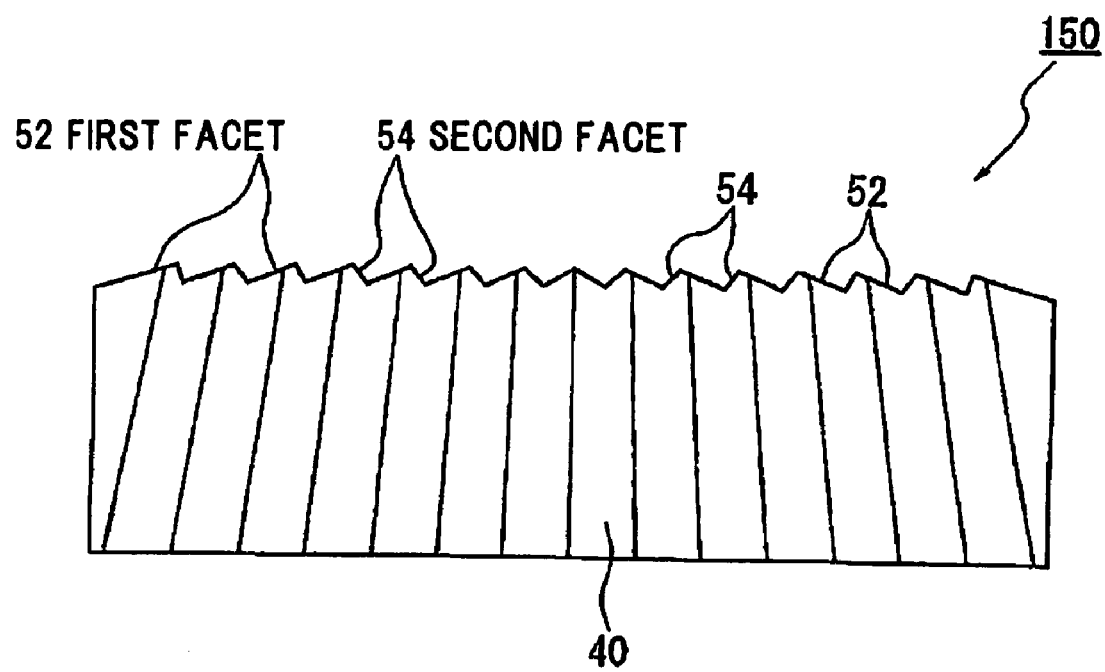
FIG. 4 is a schematic cross sectional view showing a group III nitride semiconductor free-standing substrate in the case that the surface of the sapphire substrate is a C-plane without off-angle.
Figure 5:
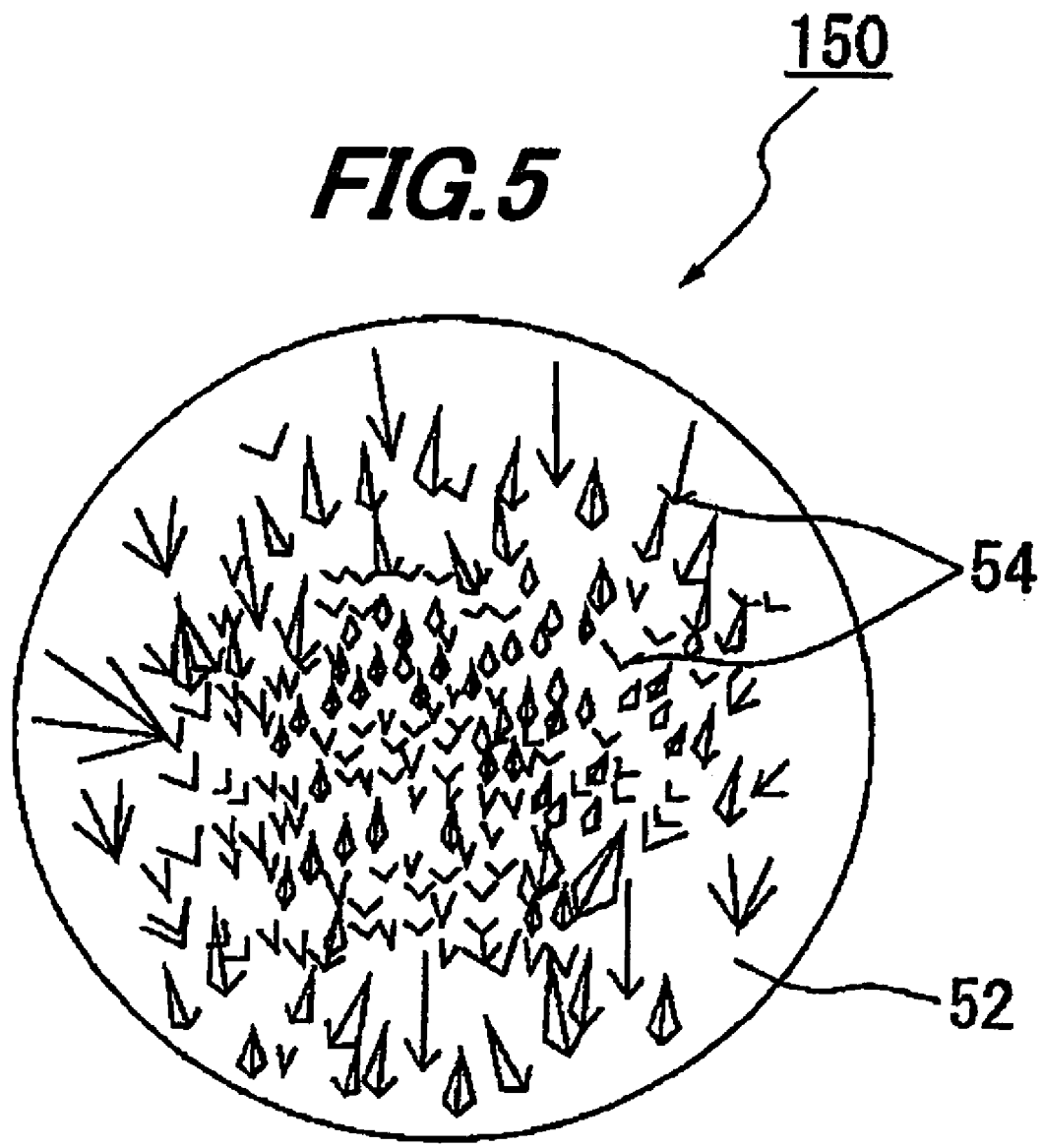
FIG. 5 is a schematic plan view showing a group III nitride semiconductor free-standing substrate in the case that the surface of the sapphire substrate is a C-plane without off-angle.

Case that the Surface of the Sapphire Substrate 10 is a C-Plane without Off-Angle FIG. 4 is a schematic cross sectional view showing a group III nitride semiconductor free-standing substrate in the case that the surface of the sapphire substrate is a C-plane without off-angle, and FIG. 5 is a schematic plan view showing a group III nitride semiconductor free-standing substrate in the case that the surface of the sapphire substrate is a C-plane without off-angle.

When the surface of the sapphire substrate 10 as a seed crystal substrate is not inclined in the a-axis direction from the C-plane and is determined as a C-plane without off-angle, a surface of an obtained free-standing substrate 150 just after the crystal growth is covered by a C-plane having a Ga polarity, however, the surface of the free-standing substrate 150 just after the crystal growth observed by a microscope is not flat and is in a state that the facet 52 and the facet 54 (microscopic crystal plane) caused by the crystal growth are randomly arranged, as shown in FIG. 4. The first facet 52 upwardly inclined from an edge toward a center of the surface in FIG. 4 is not a C-plane of the GaN 40, but is a plane slightly inclined from the C-plane at an angle of 1° or less. In addition, the second facet 54 downwardly inclined from the edge toward the center of the surface in FIG. 4 is not a C-plane of the GaN 40, but is a plane slightly inclined from the C-plane of the GaN 40 at an angle of less than 10° as well as at an angle larger than the inclination angle of the first facet with respect to the C-plane. Here, the area of the first facet 52 is larger than that of the second facet 54. Herein, a facet means a plane that forms a particular angle with respect to a certain crystal orientation. For example, an angle formed by the C-axis and the first facet is constant in a substrate surface.

Reason why a Crystal Plane Other than C-Plane Appears

The first facet 52 and the second facet 54 are formed on the surface of the free-standing substrate 150 under the combined conditions of atmosphere, temperature and pressure, etc., during the crystal growth of the GaN 40 so that the first facet 52 is more stable than the C-plane. The mechanism for stabilizing the specific facet can be explained as follows. Since there is no bonding partner for the atoms on the surface of the crystal, atoms on the uppermost surface is in a high-energy state with tangling bonds. This state is unstable, thus, the adjacent atoms couple bonds thereof each other on the uppermost surface of the crystal, or couple with other types of atoms present in the growth atmosphere such as hydrogen, and the surface atoms are thereby reconstructed to reduce the tangling bonds. Furthermore, when a plane of the crystal is different, the reconstructed structure is also different, which may cause that the reconstructed structure of a certain plane is energetically more stable than the reconstructed structure of another plane. Therefore, when taking a certain specific growth condition (atmosphere, temperature and pressure, etc.) into consideration, a crystal plane in which the energetically most stable reconstructed structure is obtained is the most stable plane and is likely to appear during the crystal growth. Especially, when a crystal having a thickness of several hundreds μm or more is grown such as the case where the free-standing substrate 150 formed of the group III nitride semiconductor is grown, since irregularity on the surface is still allowed to change in the process of the crystal growth, the most stable plane is likely to appear during the crystal growth even if the surface of the seed crystal substrate is not the most stable plane.

In other words, it can be understood that the first facet 52 appeared during the crystal growth in FIGS. 4 and 5 since, among the planes close to the surface (C-plane) of the seed crystal, it is a plane which has the energetically most stable reconstructed structure. As is obvious from FIG. 4, if the whole surface of the free-standing substrate 150 is cover by the first facet 52, it is necessary to have film thickness distribution larger than that by the crystal growth. Since it is not such film thickness distribution in effect, it is not possible to compose the surface only by the first facet 52, and the adjacent first facets 52 are connected by the second facet 54 which is a different type.

Figure 12:
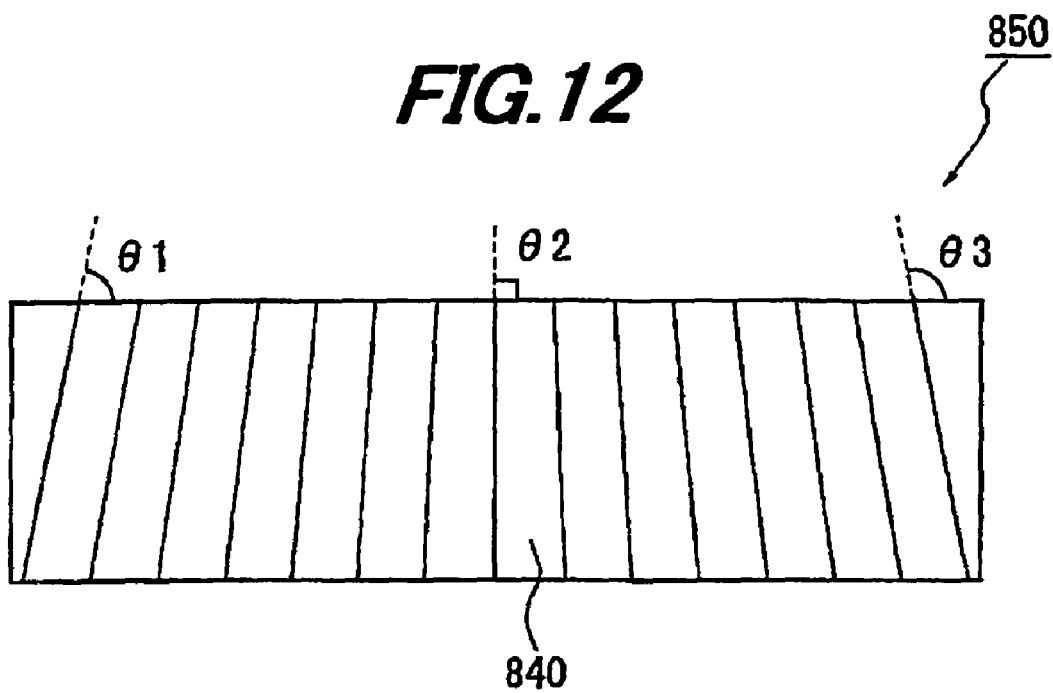
FIG. 12 shows an example of the prior art and is a schematic view of a group III nitride semiconductor free-standing substrate showing a state in which an angle formed by a predetermined crystal axis and a surface continuously varies in the substrate surface.

Disadvantage in the Case that the Surface of the Sapphire Substrate 10 is a C-Plane without Off-Angle In case of growing a device structure on the free-standing substrate 150 of FIGS. 4 and 5, when a surface polished flat is used, the crystal orientation of the surface varies depending on the position in the same manner as the case of FIG. 12, and the device characteristics become non-uniform. Meanwhile, when the free-standing substrate 150 is used without polishing the surface, since both of the first facet 52 and the second facet 54 are included in a single device, and further, since it is not possible to control the position and the ratio of each of the facets 52 and 54, it is still not possible to uniform the device characteristics.

For example, in case of the crystal growth of a light-emitting device structure including an InGaN active layer on the free-standing substrate 150, since material atoms (Ga, In) are introduced into the first facet 52 and the second facet 54 in the different manner during the crystal growth, the In composition in the InGaN layer is different between each of facets 52 and 54, which results in that light is emitted at different wavelength on each of facets 52 and 54. When, e.g, a LED is manufactured in this state, an emission wavelength of the LED in a wafer plane largely differs in accordance with a ratio of the first facet 52 to the second facet 54 in the wafer plane. Furthermore, when a LD is manufactured on this free-standing substrate 150, laser oscillation is not possible since a gain required for the laser oscillation is not obtained.

Meanwhile, when the free-standing substrate 150 is used as a seed crystal and a HEMT structure formed of GaN/AlGaN is grown on a surface thereof, an Al composition in an AlGaN layer is different in each of the facets 52 and 54. Since an electron concentration in the GaN/AlGaN HEMT depends on the Al composition in the AlGaN layer, the electron concentration is different at each position, hence, the resistance of the device is different.

Case that the Surface is Inclined from the C-Plane in the Range of Less than 0.35°

Figure 6:
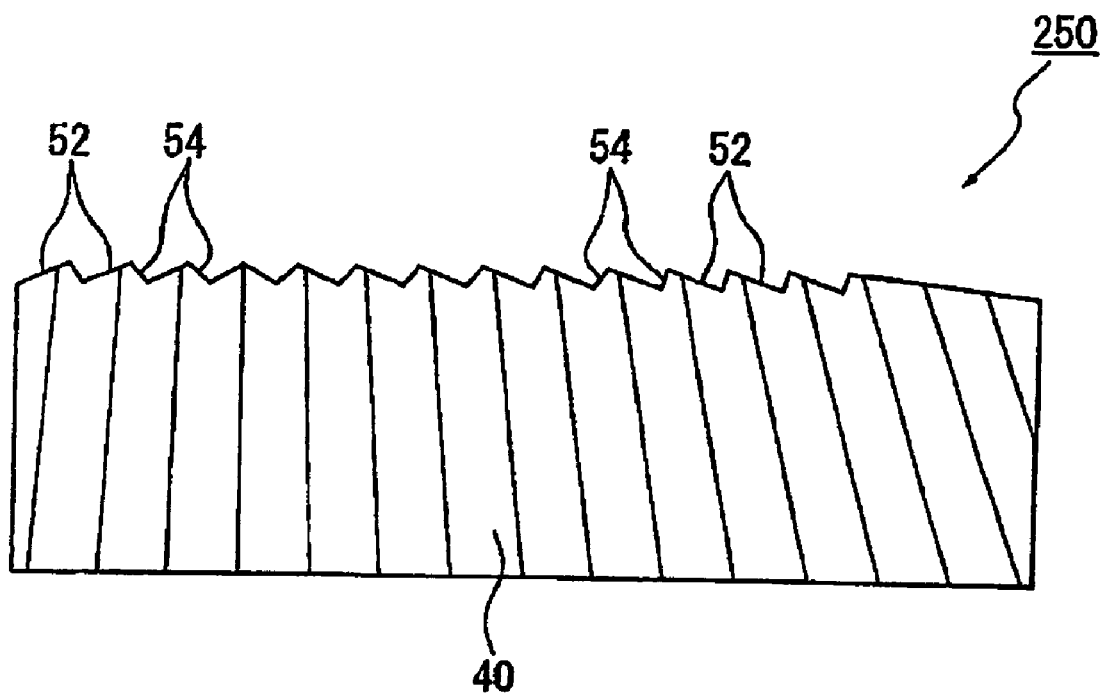
FIG. 6 is a schematic cross sectional view showing a group III nitride semiconductor free-standing substrate when the surface of the sapphire substrate is inclined from the C-plane in a range of less than 0.35°.

FIG. 6 shows a schematic cross section of a group III nitride semiconductor free-standing substrate when the surface of the sapphire substrate is inclined from the C-plane in a range of less than 0.35°

Here, as a free-standing substrate 250 shown in FIG. 6, when the sapphire substrate 10 of which surface is inclined from the C-plane in a range of less than 0.35° is used, the first facet 52 is not remarkably different from that in the case where the surface of the sapphire substrate 10 is the C-plane without off-angle in that, although there are regions having slightly large area, the surface is subdivided by the second facet 54.

Case that the Surface is Inclined from the C-Plane in the Range of not Less than 0.35° and not More than 0.8°

As is the present embodiment, when the surface of the sapphire substrate 10 is inclined in the a-axis direction from the C-plane in the range of not less than 0.35° and not more than 0.8° and is grown in a region in which the growth rate does not linearly vary with respect to the variation in the supply amount of the group III raw material as described later, the surface condition drastically changes and the area of the first facet 52 is largely enlarged, which results in a state that more than half of the region of the surface of the free-standing substrate 50 is covered by the single crystal plane. When the GaN 40 is grown on the sapphire substrate 10 having a crystal plane close to the C-plane on the surface thereof, since the GaN 40 grows such that the a-axis of the sapphire substrate 10 coincides with the m-axis of the GaN 40, the surface of the GaN 40 will be a plane inclined in the m-axis direction from the C-plane.

Growth Conditions of the Group III Nitride Semiconductor

However, the first facet 52 is not necessarily stabilized under any growth conditions. From the test by the inventors, it has been revealed that it is necessary to grow in a region in which the growth rate does not linearly vary with respect to the variation in the supply amount of the group III raw material in order to stabilize the first facet 52. According to the test by the inventors, the first facet 52 was stabilized when the V/III ratio was 6 or less and was relatively lowered. This is a region in which the growth rate does exhibit saturated behavior and thus does not linearly vary due to the relatively low concentration of the group V raw material even if the supply of the group III raw material is increased. In other words, the growth is carried out not in a group III supply rate limited region which is used for the typical HVPE growth but in a group V supply rate limited region, and it is possible to obtain a free-standing substrate in which more than half of the region of the substrate surface has a single crystal plane formed of the first facet 52 only when grown in the group V supply rate limited region. When the growth is carried out in the group III supply rate limited region, the first facet 52 is not stabilized, and only the disordered surface morphology as shown in FIGS. 5 and 6 in which the facets 52 and 54 are mixed is obtained even though the surface of the sapphire substrate 10 is inclined even from the C-plane in the range of not less than 0.35° and not more than 0.8°.

Percentage of the Region Covered by the Single Crystal Plane

Here, regarding the free-standing substrate 50, when the area of the region of the largest first facet 52 in which the crystal plane is continuously formed is defined as a first area S1 and the area of the region on the wafer excluding the first area S1 is defined as a second area S2, the percentage of the region covered by the single crystal plane is S1/(S1+S2). In this regard, the first area S1 is in principle derived from a region which is reachable without crossing the second facet 54 on the wafer surface by selecting the first facet 52 which is the widest on the wafer. When a distance between the closest first facets 52 is less than 5 mm, the second facets are deemed to be coupled. Therefore, as shown in FIG. 3, when a second facet 54a is independently formed with a distance between the closest second facets 54 in the first facet 52 of 5 mm or more, the second facet 54a is not deemed to be coupled, and the region surrounded by the outer rim of the first facet 52 and the second facet 54 deemed to be coupled is defined as the first area S1. When the significant figure is one digit, S1/(S1+S2) is 0 in the free-standing substrate 50 of FIG. 5 and S1/(S1+S2) is 0.7 in the free-standing substrate 50 of FIG. 3.

Case that the Surface is Inclined from the C-Plane in the Range More than 0.8°

Here, when the surface of the sapphire substrate 10 is largely inclined in the a-axis direction from the C-plane at over 0.8°, the first facet 52 is subdivided into the second facets 54, and the surface exhibits the morphology similar to FIG. 5 and S1/(S1+S2) becomes 0. If the device structure is grown on this free-standing substrate 50, the uniformity of the device characteristics is largely lost in the same manner as the free-standing substrate 150 of FIG. 5.

Nitride Semiconductor Device Using the Free-Standing Substrate 50 of the Embodiment When a nitride semiconductor layer is formed on the free-standing substrate 50 shown in FIGS. 2 and 3 to form a device, the device characteristics are significantly more stable in a region having a surface covered by a single crystal plane than in a region having facets randomly arranged. For example, in case of the crystal growth of a light-emitting device structure including an InGaN active layer on the free-standing substrate 50, since material atoms (Ga, In) during the crystal growth are uniformly introduced on the single crystal plane, light is emitted at the same wavelength. In this state, when an LED is manufactured, the uniformity of the emission wavelength in the wafer plane is significantly improved, and when an LD is manufactured, it is possible to easily perform the laser oscillation. In addition, when the free-standing substrate 50 is used as the seed crystal and the HEMT formed of GaN/AlGaN is grown on the surface thereof, the Al composition in the AlGaN layer is uniformed and the device characteristics become uniform.

Effects of the Embodiment

Figure 13:
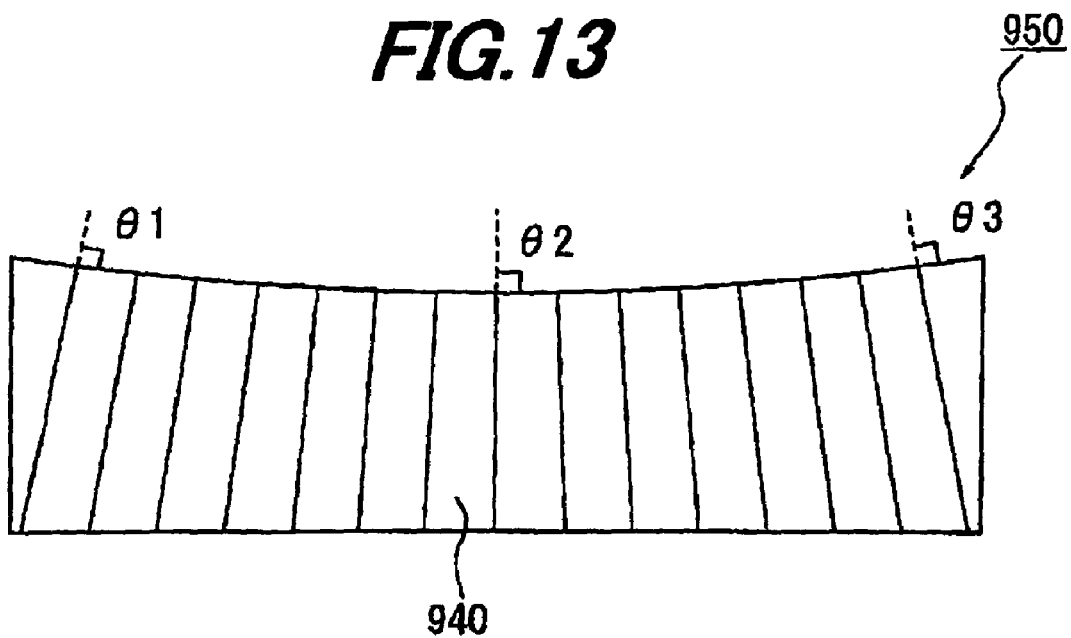
FIG. 13 shows an example of the prior art and is a schematic view showing a group III nitride semiconductor free-standing substrate of which surface is spherically polished.

According to the embodiment of the invention, a relatively wide energetically stable single crystal plane can be automatically formed on the surface of the free-standing substrate 50 by the crystal growth of the group III nitride semiconductor. Therefore, it is possible to manufacture a high-quality free-standing substrate 50 at low cost as well as at high reproducibility without requiring artificial and intentional formation of a plane having the uniform crystal axes as shown in FIG. 13 by accurately controlling the film thickness distribution and the polished shape during the crystal growth.

When the orientation of the single crystal plane in the free-standing substrate 50 of the present embodiment was measured by X-ray diffraction, the measurement result was obtained that a plane is inclined in the m-axis direction from the C-plane in the range of not less than 0.4° and not more than 1.0°. The range in the measured angles is caused because the surface of the free-standing substrate 50 is not completely flat and the crystal plane is curved.

Preferable Aspect of the Free-Standing Substrate 50

S1/(S1+S2) is preferably 0.5 or more for the practical application of the free-standing substrate 50 of the present embodiment. From this, more than half of the region of the free-standing substrate 50 is covered by the single crystal plane, the characteristics of the device manufactured on the crystal plane are stabilized and a relatively high yield is assured.

Modifications of the Embodiment

Although the growth of the GaN 40 by the HVPE method has been explained in the embodiment, the GaN 40 can be grown by other vapor-phase growth methods such as, e.g., a MOVPE method or a molecular beam epitaxy method (MBE method). In addition, although the free-standing substrate 50 formed of the GaN 40 has been shown, it is possible to obtain the same result in the free-standing substrate 50 formed of other group III nitride semiconductors such as, e.g., AlN, InN, AlGaN, InGaN and InAlGaN.

Furthermore, although the growth of the group III nitride semiconductor on the C-plane of the sapphire substrate 10 has been explained in the embodiment, it is possible to grow the group III nitride semiconductor on the C-plane of, e.g., a SiC substrate, and it is possible to use other substrates as long as it is a seed crystal substrate having a hexagonal crystal structure. Yet alternatively, it is possible to grow the group III nitride semiconductor on the (111) plane of the seed crystal substrate having the hexagonal crystal structure, such as GaAs or Si.

When the seed crystal substrate having the hexagonal crystal structure is used, the surface of the seed crystal substrate is inclined in a [211] direction from a (111) plane in a range of not less than 0.35° and not more than 0.8° and the group III nitride semiconductor is grown on the surface by the vapor-phase growth method in the region in which the growth rate does not linearly vary with respect to the variation in the supply amount of the group III raw material, and it is thereby possible to obtain the same single crystal plane as the embodiment. By the (111) plane here, it is meant a (111) plane when the seed crystal substrate is a semiconductor formed of a single material such as Si, and is meant a (111)A plane or a (111)B plane when the seed crystal substrate is a binary compound semiconductor such as GaAs. In addition, the [211] direction in the present embodiment includes all of those in which the absolute value of an index is a combination of 2, 1, 1 such as [211], [121], [2-11] or [21-1]. Here, it is preferable to use any of Si, Ge, GaAs, InP and GaP as the hexagonal seed crystal substrate.

In addition, although the single crystal plane on the surface of the free-standing substrate 50 which is inclined in the m-axis direction from the C-plane has been explained in the embodiment, it may be inclined in the a-axis direction. In this case, it is possible to obtain the same effect as the embodiment if more than half of the region of the substrate surface is the single crystal plane. Alternatively, the surface of the free-standing substrate 50 may be inclined in a c-axis or a-axis direction from an M-plane, and the single crystal plane at this time is also to be more than half of the substrate surface in the same manner as the embodiment. The inclination angle is preferably not less than 0.4° and not more than 1.0° in the same manner as the embodiment.

When the free-standing substrate 50 of which surface is inclined in the a-axis direction from the C-plane is manufactured, the seed crystal substrate having the hexagonal crystal structure formed of sapphire is used, the surface of the seed crystal substrate is inclined in a direction corresponding to the m-axis from the C-plane in a range of not less than 0.35° and not more than 0.8°, and the group III nitride semiconductor is grown on the surface by the vapor-phase growth method in the region in which the growth rate does not linearly vary with respect to the variation in the supply amount of the group III raw material. In addition, it is possible to obtain the single crystal plane by, using the seed crystal substrate having the hexagonal crystal structure, inclining the surface of the seed crystal substrate in a [110] direction from the (111) plane in the range of not less than 0.35° and not more than 0.8°, and growing the group III nitride semiconductor on the surface by the vapor-phase growth method in the region in which the growth rate does not linearly vary with respect to the variation in the supply amount of the group III raw material. By the (111) plane here, it is meant a (111) plane when the seed crystal substrate is a unitary semiconductor such as Si and is meant a (111)A plane or a (111)B plane when the seed crystal substrate is a binary semiconductor such as GaAs. In addition, the [110] direction in the present embodiment includes all of those in which the absolute value of an index is a combination of 1, 1, 0 such as [110], [101], [1-10] or [-1-10].

When the free-standing substrate 50 of which surface is inclined in the c-axis or a-axis direction from the M-plane is manufactured, the seed crystal substrate having the hexagonal crystal structure is used, the surface of the seed crystal substrate is inclined in the c-axis or a-axis direction from the M-plane in the range of not less than 0.35° and not more than 0.8°, the group III nitride semiconductor is grown on the surface by the vapor-phase growth method in the region in which the growth rate does not linearly vary with respect to the variation in the supply amount of the group III raw material, and it is thereby possible to obtain the single crystal surface.

The invention will be explained in further detail below based on Examples. However, the invention is not intended to be limited thereto.

Example 1

In Example 1, plural GaN free-standing substrates having a surface close to the C-plane having a Ga polarity were made by the VAS method. The sapphire substrate 10 with a diameter of 2 inches was selected as a seed crystal substrate, the plural sapphire substrates 10 having different inclinations in the a-axis direction from the C-plane were used and the variation in the value of S1/(S1+S2) was examined. For making a specimen, after a 300 nm thick GaN thin film 20 was formed on the C-plane of the sapphire substrate 10 by the MOVPE method, the Ti 30 was deposited so as to have the openings 32 on the surface of the GaN thin film 20 and was then heat-treated, thereby forming the void structure 22 on the GaN thin film 20. The GaN 40 was grown in a thickness of 500 μm thereon by the HVPE method and the sapphire substrate 10 side from the void structure 22 was removed from the GaN 40, thereby obtaining the free-standing substrate 50 formed on the GaN 40.

The growth conditions of GaN by the HVPE method were determined to be ordinary pressure and the substrate temperature of 1100° C., and an n-type GaN layer in which Si atom was doped at a concentration of $1 \times 10^{18}/cm^3$ was grown. GaCl gas, which was prepared by spraying hydrochloric acid on metal gallium heated to 800° C. in an HVPE apparatus, was used as a group III raw material. In addition, $NH_3$ gas was used as a group V raw material and dichlorosilane gas was used as a Si material. Then, mixture gas of hydrogen and nitrogen was used as carrier gas.

Figure 7:
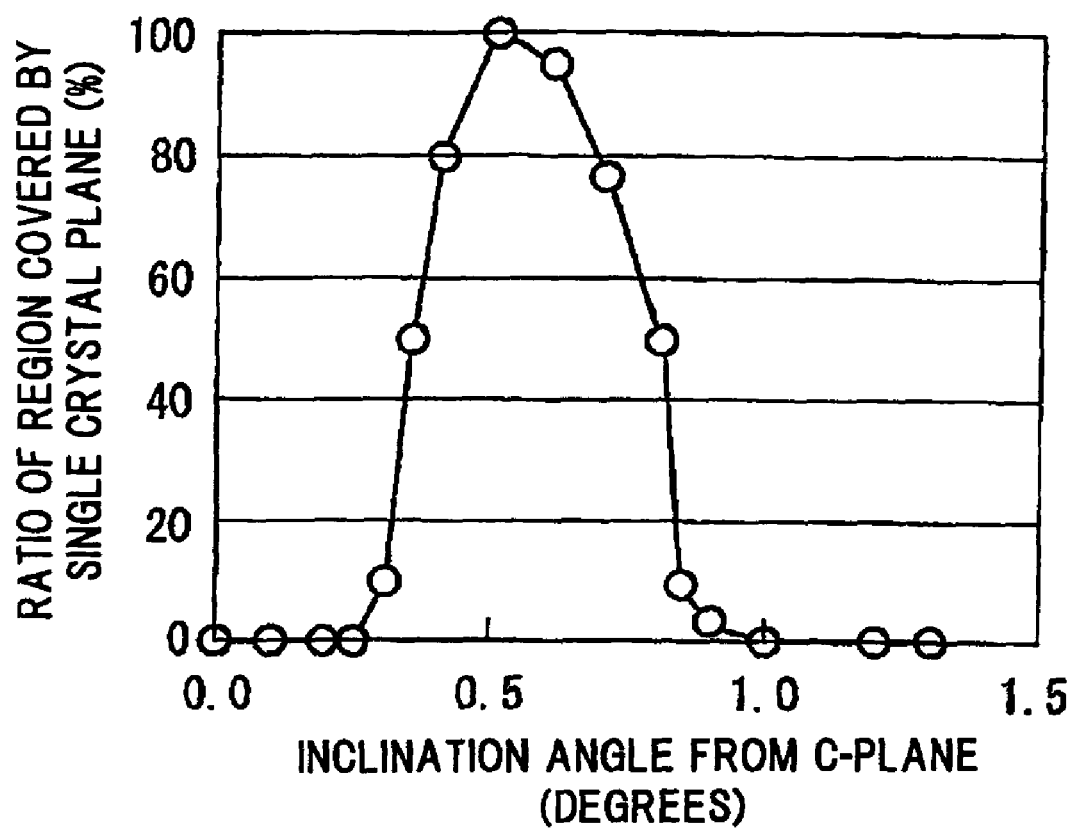
FIG. 7 is a graph showing a relation between an inclination angle from a C-plane on a surface of a seed crystal substrate and a ratio of a region of the free-standing substrate just after growth covered by a single crystal plane in Example 1.

In Example 1, the V/III ratio was adjusted to not less than 1 and not more than 6 by setting the flow rate of the hydrochloric acid to not less than 200 ccm and not more than 2000 ccm and the flow rate of $NH_3$ to not less than 400 ccm and not more than 6000 ccm, and a specimen was made. The growth rate was in the range of not less than 200 μm/hr and not more than 1000 μm/hr. The variation in the value of S1/(S1+S2) with respect to the inclination in the a-axis direction from the C-plane is shown in FIG. 7. FIG. 7 is a graph showing a relation between an inclination angle from a C-plane on a surface of a seed crystal substrate and a ratio of a region of the free-standing substrate in an as-grown state just after growth covered by a single crystal plane formed of the first facet in Example 1.

As shown in FIG. 7, when the inclination angle from the C-plane of the sapphire substrate is less than 0.35° as well as over 0.8°, the percentage of the single crystal plane on the surface of the manufactured GaN free-standing substrate is critically decreased. In detail, S1/(S1+S2) was 10% or less in Example 1.

By contrast, when the inclination angle from the C-plane is not less than 0.35° and not more than 0.8°, the percentage of the single crystal plane on the surface of the manufactured GaN free-standing substrate is critically increased. In detail, S1/(S1+S2) was 50% or more in Example 1.

Particularly, when the inclination angle from the C-plane is not less than 0.5° and not more than 0.6°, the substantially entire surface of the manufactured GaN free-standing substrate is the single crystal plane. In detail, S1/(S1+S2) was 95% or more in Example 1.

When the surface roughness of the region in which the single crystal plane was obtained was examined by an atomic force microscope (AFM), an RMS value in the region of 100 μm square was not less than 1.5 nm and not more than 5.0 nm. On the other hand, the RMS value was 8.0 nm or more in the region in which the facets are randomly arranged. In addition, when dislocation density of the surface of the obtained GaN free-standing substrate was derived by observing dark spots using a cathodoluminescence image, it was in the range of not less than $5 \times 10^5/cm^2$ and not more than $4 \times 10^5/cm^2$ in any of the specimens. Meanwhile, when an orientation of the single crystal plane of the manufactured GaN free-standing substrate in case of not less than 0.35° and not more than 0.8° of the inclination angle from the C-plane of the sapphire substrate was measured by the X-ray diffraction, all of the GaN free-standing substrates had a plane inclined in the m-axis direction from the C-plane of the GaN free-standing substrate, varying in a range from 0.4° to 1.0°. The reason why the measured angle varies is that the single crystal plane is curved. When an angle formed by the first facet and the C-axis is defined as α and an angle formed by the second facet and the C-axis is defined as β, the values of α and β do not change and only the ratio of the area of the first facet to that of the second facet changes even when the inclination angle from the C-plane on the surface of the seed crystal substrate changes.

Figure 8:
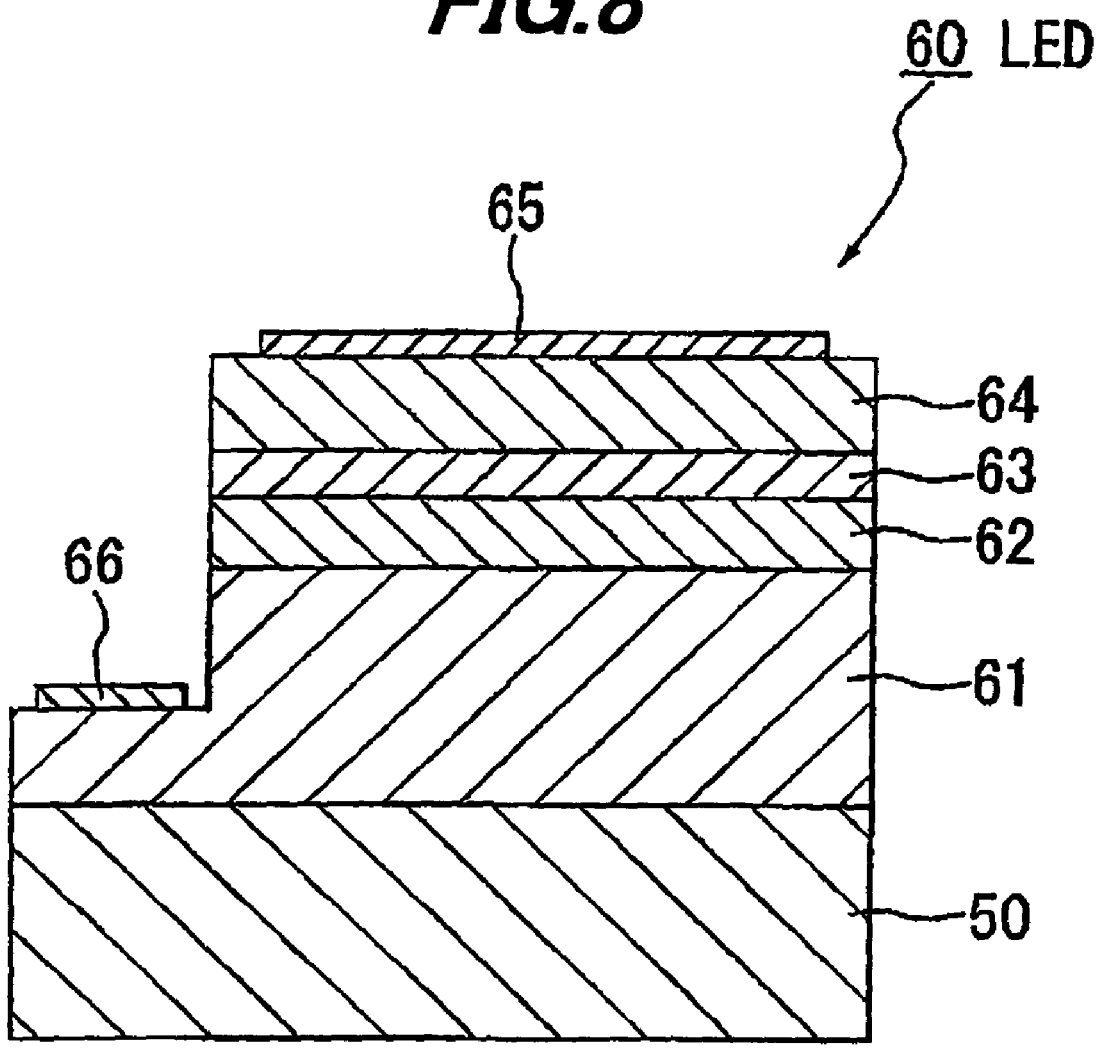
FIG. 8 is a schematic view showing a LED manufactured in Example 1.

FIG. 8 is a schematic view showing a LED manufactured in Example 1.

Next, the back surface of the obtained GaN free-standing substrate was polished so as to have a center thickness of 330 μm, a flat back surface and a diameter of 2 inches. Then, as shown in FIG. 8, a blue LED structure formed of a nitride semiconductor was grown on the surface of the GaN free-standing substrate by the MOVPE method under ordinary pressure. In detail, a 1 μm thick n-GaN layer ($n=2 \times 10^{18}/cm^3$) 61 was grown in contact with the GaN free-standing substrate 50 at 1100° C., and a 6-period InGaN (3 nm)/GaN (10 nm) multi quantum structure 62 was subsequently grown. After that, a 30 nm Mg-doped p-AlGaN layer 63 and a 200 nm Mg-doped p-GaN layer 64 were grown by adjusting the growth temperature to 1100° C. again. Then, a p-side electrode 65 formed of Ni/Au was formed on the Mg-doped p-GaN layer 64, an n-side electrode 66 formed on Ti/Al was formed on the n-GaN layer 61 and was subsequently divided into 300 μm squares, thereby forming a LED 60.

Then, the emission wavelength at the time of conducting 20 mA to the LED 60 obtained from each wafer was examined. The result of the derived dispersion σ in the peak wavelength is shown in FIG. 9.

Figure 9:
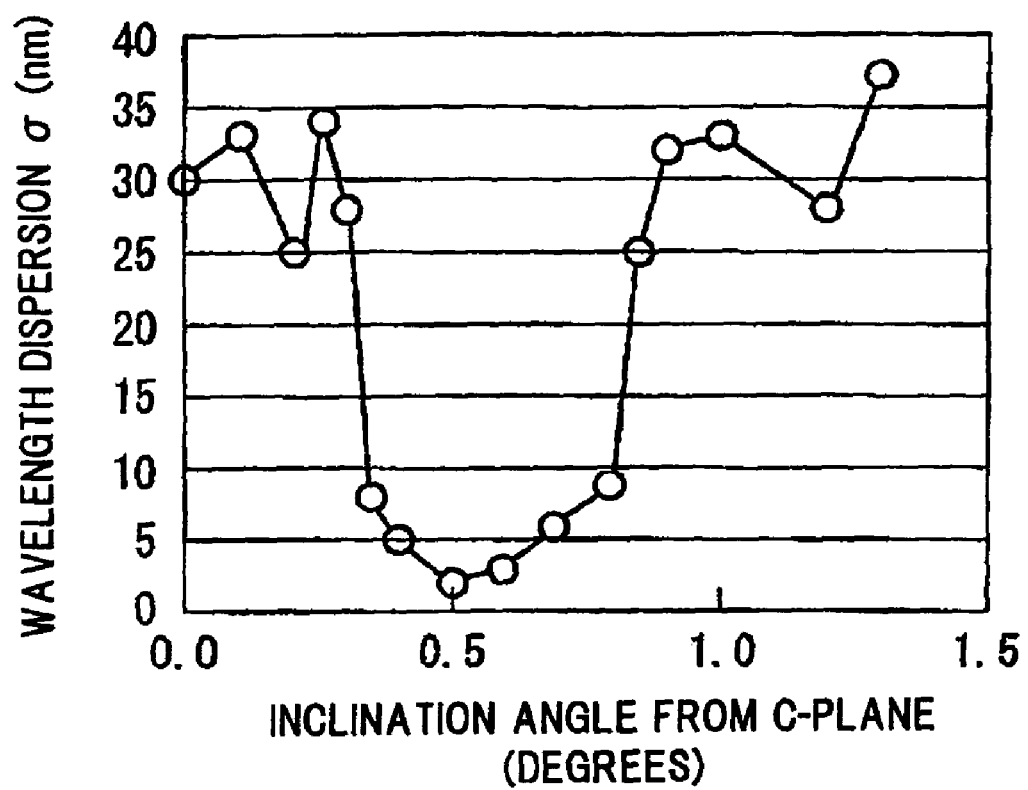
FIG. 9 is a graph showing a relation between an inclination angle from a C-plane on a surface of a seed crystal substrate and peak wavelength dispersion σ in the manufactured LED.

FIG. 9 is a graph showing a relation between an inclination angle from a C-plane on a surface of a seed crystal substrate and peak wavelength dispersion σ in the manufactured LED.

As shown in FIG. 9, in the LED using the upside of the free-standing substrate 50 in which S1/(S1+S2) is less than 50%, the emission wavelength was largely dispersed within the plane and the dispersion σ was 20 nm or more. On the other hand, in the LED formed on the GaN free-standing substrate 50 in which S1/(S1+S2) is 50% or more, the dispersion in the wavelength was relatively small and the dispersion σ was 10 nm or less.

This result shows that the emission wavelength of the LED can be uniform in a plane by forming the surface of the sapphire substrate at the time of making the GaN free-standing substrate so as to have an inclination angle from the C-plane in the range of not less than 0.35° and not more than 0.8°.

Figure 10:
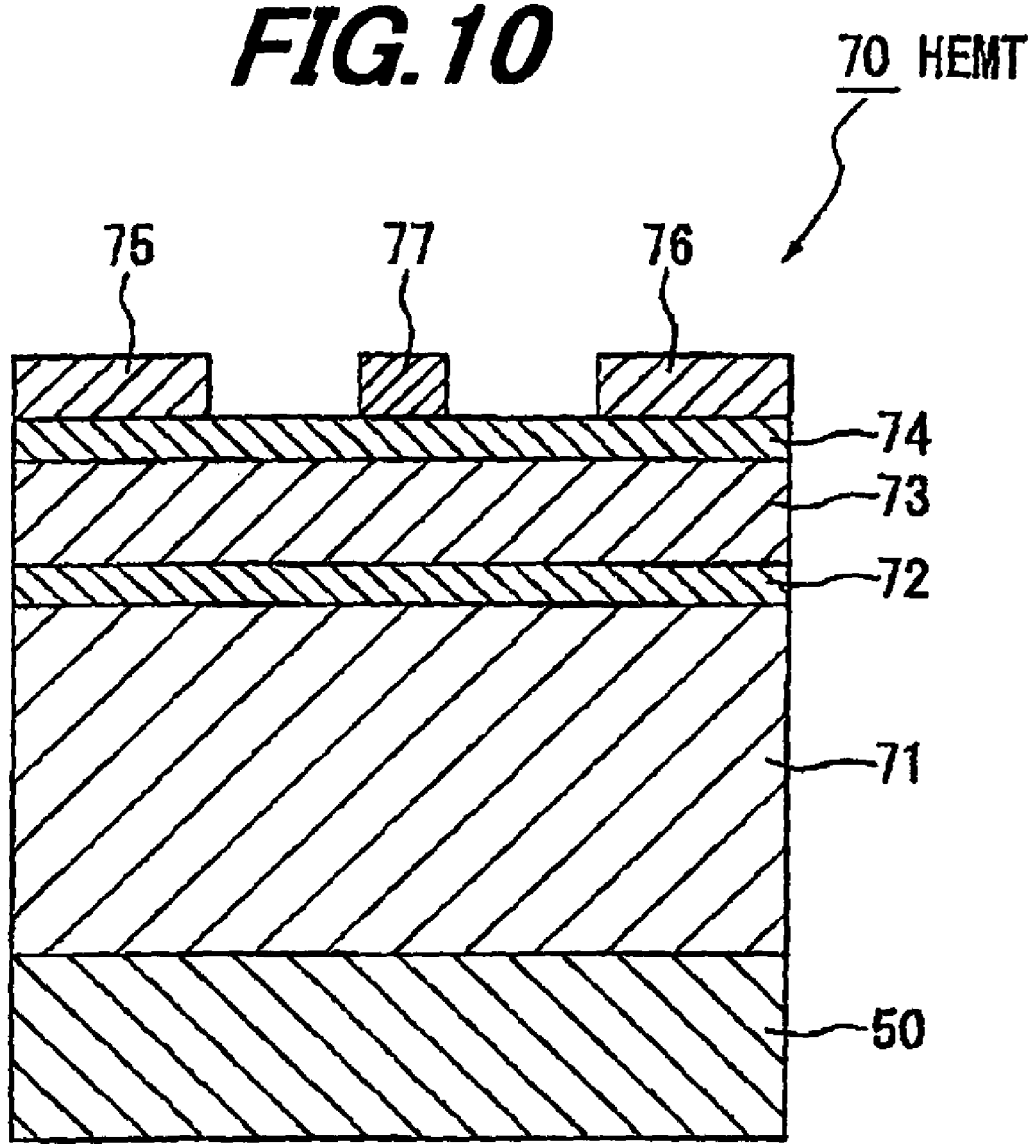
FIG. 10 is a schematic view showing a HEMT manufactured in Example 1.

FIG. 10 is a schematic view showing a HEMT manufactured in Example 1.

Meanwhile, a HEMT structure formed of a nitride semiconductor was grown on the surface of the GaN free-standing substrate having a center thickness of 330 μm, a flat back surface and a diameter of 2 inches by the MOVPE method under normal pressure. In detail, as shown in FIG. 10, a 1 μm thick undoped GaN layer 71 was grown in contact with the free-standing substrate 50 at 1100° C., and subsequently, a 5 nm undoped $Al_xGa_{1-x}$ layer 72, a 20 nm n-$Al_xGa_{1-x}N$ layer 73 and a 5 nm undoped $Al_xGa_{1-x}N$ layer 74 were grown at 1100° C. In Example 1, x was 0.25 and the carrier concentration of the n-$Al_xGa_{1-x}N$ layer 73 was $2\times10^{18}/cm^3$. After this, a Ti/Al source electrode 75, a Ti/Al drain electrode 76 and a Ni/Au gate electrode 77 were formed on the undoped $Al_xGa_{1-x}N$ layer 74, and a HEMT 70 was thereby manufactured.

Then, the threshold voltage of the HEMT 70 obtained from each wafer was examined. The result of the derived dispersion a is shown in FIG. 11.

Figure 11:
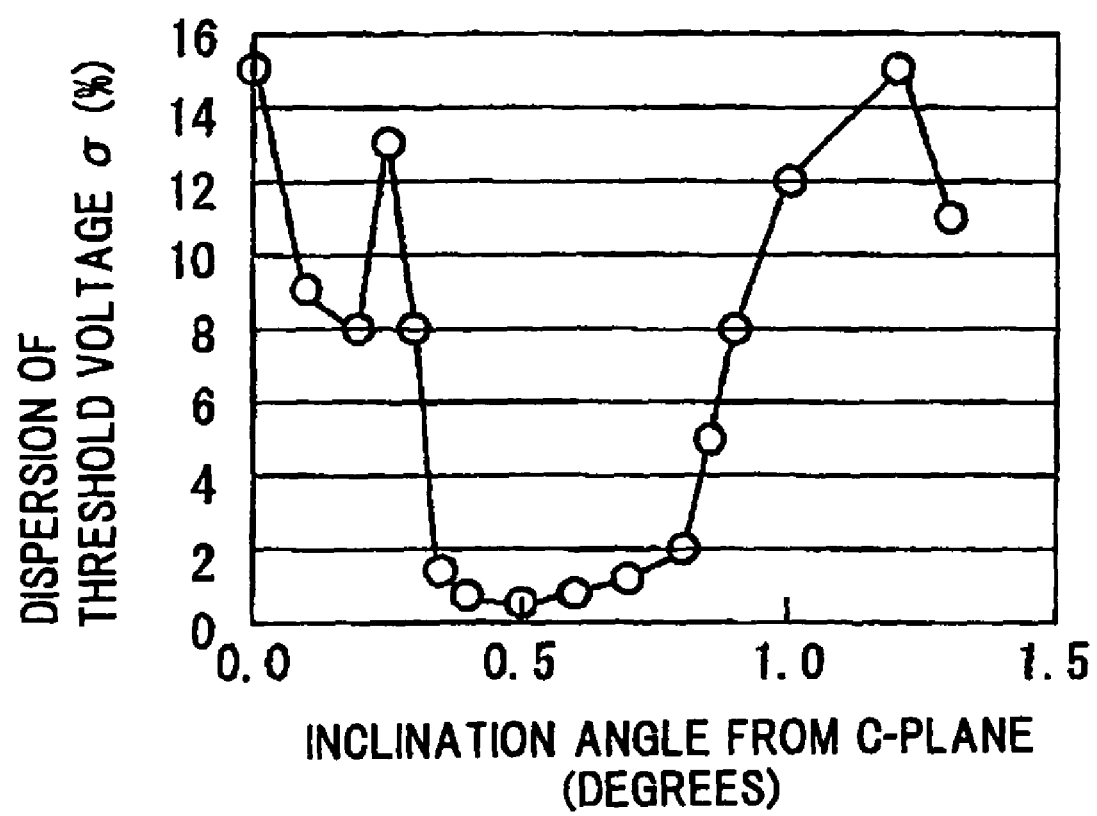
FIG. 11 is a graph showing a relation between an inclination angle from a C-plane on a surface of a seed crystal substrate and dispersion σ of threshold voltage in the manufactured HEMT.

FIG. 11 is a graph showing a relation between an inclination angle from a C-plane on a surface of a seed crystal substrate and dispersion a of threshold voltage in the manufactured HEMT.

As shown in FIG. 11, in the HEMT using the GaN free-standing substrate 50 in which S1/(S1+S2) is less than 50%, the threshold voltage was largely dispersed within the plane and the dispersion σ was 5% or more. On the other hand, in the HEMT using the upside of the GaN free-standing substrate 50 in which S1/(S1+S2) is 50% or more, the dispersion in the threshold voltage was relatively small and the dispersion σ was 2% or less. This result shows that the threshold voltage of the HEMT to be manufactured can be reduced by forming the surface of the sapphire substrate at the time of making the GaN free-standing substrate so as to have an inclination angle from the C-plane in the range of not less than 0.35° and not more than 0.8°.

Although the back surface polishing of the manufactured group III nitride semiconductor free-standing substrate 50 after the growth has been explained here, the morphology of the back surface may be either a mirror surface or a rough surface. From the viewpoint of ease of visually distinguishing the front and back surfaces, the RMS value of the surface roughness for the rough surface is preferably not less than 0.2 μm and not more than 2 μm. In addition, although the free-standing substrate 50 is formed in a substantially circular shape just after the growth, the accuracy of the circular shape may be improved by further shaping the outer periphery, or the edge surface may be tapered. Furthermore, orientation flat or index flat may be provided in order to clearly indicate the crystal orientation at a portion of the outer periphery.

Example 2

While the sapphire substrate was used as the seed crystal substrate, the same test as Example 1 was conducted using each of SiC, GaN, AlN, InN, AlGaN, InGaN and InAlGaN substrates having a hexagonal crystal structure instead of using the sapphire substrate. The test was conducted under the same conditions as Example 1 except that the seed crystal substrates having a surface inclined in the m-axis direction from the C-plane were used. The test result was the same as that of Example 1.

Example 3

The same test as Example 1 was conducted by growing GaN directly on the seed crystal substrate using the HVPE method without passing through the process of forming a void structure by growing a GaN thin film using the MOVPE method. In addition to the sapphire substrate, SiC, GaN, AlN, InN, AlGaN, InGaN and InAlGaN substrates were respectively used as a seed crystal substrate for the respective tests. When the seed crystal substrate other than sapphire was used, the seed crystal substrates having a surface inclined in the m-axis direction from the C-plane were used. When a substrate other than GaN was used as a seed crystal substrate, the seed crystal substrate was removed by etching or laser removal after growing GaN. In addition, when GaN was used as a seed crystal substrate, GaN of the seed crystal substrate and the grown GaN were integrated, which formed a GaN free-standing substrate as a whole. The test result was the same as that of Example 1.

Example 4

The same tests as Example 3 were respectively conducted using respective Si, Ge, GaAs, InP and GaP substrates having a cubic crystal structure as a seed crystal substrate. The tests were conducted under the same conditions as Example 3 except that the surface of the seed crystal substrate was a (111) plane and was inclined in a [211] direction. The test result was the same as that of Example 1.

Example 5

The sapphire substrate as a seed crystal substrate was changed to the substrate having a surface inclined in the m-axis direction from the C-plane, and the same test as Example 1 was conducted. The test result was the same as that of Example 1 except that the surface of the obtained GaN free-standing substrate formed of the single crystal plane was inclined in the a-axis direction of GaN from the C-plane in the range of not less than 0.4° and not more than 1.0°.

Example 6

Respective SiC, GaN, AlN, InN, AlGaN, InGaN and InAlGaN substrates having a hexagonal crystal structure were used as a seed crystal substrate, and the tests were respectively conducted under the same conditions as Examples 2 and 3 except that the seed crystal substrate have a surface inclined in the a-axis direction from the C-plane. The test result was the same as that of Example 1.

Example 7

Respective Si, Ge, GaAs, InP and GaP substrates having a cubic crystal structure were used as a seed crystal substrate, the surface of the seed crystal substrate was determined to be a (111) plane and was inclined in a [110] direction at the same angle, and the same test as Example 3 was each conducted. The test result was the same as that of Example 1.

Example 8

Respective SiC, GaN, AlN, InN, AlGaN, InGaN and InAlGaN substrates having a hexagonal crystal structure were respectively used as a seed crystal substrate, and the tests were respectively conducted under the same conditions as Examples 2 and 3 except that the seed crystal substrate has a surface inclined in the c-axis or a-axis direction from the M-plane. The test result was the same as that of Example 1.

Example 9

The group III nitride semiconductor grown by the HVPE method was changed to AlN, InN, AlGaN, InGaN and InAlGaN, and the same tests as Examples 1-8 were respectively conducted. The test result was the same as that of Example 1.

Example 10

The wafer size was changed to 3, 4, 5 and 6 inches, and the same tests as Examples 1-9 were respectively conducted. The test result was the same as that of Example 1.

Although the invention has been described with respect to the specific embodiment for complete and clear disclosure, the appended claims are not to be therefore limited but are to be construed as embodying all modifications and alternative constructions that may occur to one skilled in the art which fairly fall within the basic teaching herein set forth.

What is claimed is:

1. A group III nitride semiconductor free-standing substrate, comprising:
   an as-grown surface, more than half a region of the as-grown surface comprising a single crystal face,
   wherein said single crystal face comprises an off-angle in a c-axis direction or an a-axis direction from a M-plane with a group III polarity.

2. A group III nitride semiconductor device, comprising:
   a group III nitride semiconductor layer over the group III nitride semiconductor free-standing substrate according to claim 1.

3. A group III nitride semiconductor free-standing substrate, comprising:
   an as-grown surface, more than half a region of the as-grown surface comprising a single crystal face,
   wherein said single crystal face comprises an off-angle in an m-axis direction from a C-plane with a group III polarity.

4. A group III nitride semiconductor device, comprising
   a group III nitride semiconductor layer over the group III nitride semiconductor free-standing substrate according to claim 3.

5. The group III nitride semiconductor free-standing substrate according to claim 3, wherein the as-grown surface comprises a crystal surface in a state that a crystal is grown other than being subjected to a grinding and a polishing thereon.

6. A group III nitride semiconductor free-standing substrate, comprising:
   an as-grown surface, more than half a region of the as-grown surface comprising a single crystal face,
   wherein said single crystal face comprises an off-angle in an a-axis direction from a C-plane with a group III polarity.

7. A group III nitride semiconductor device, comprising
   a group III nitride semiconductor layer over the group III nitride semiconductor free-standing substrate according to claim 6.

8. The group III nitride semiconductor free-standing substrate according to claim 6, wherein the as-grown surface comprises a crystal surface in a state that a crystal is grown other than being subjected to a grinding and a polishing thereon.

9. The group III nitride semiconductor free-standing substrate according to claim 1, wherein the off-angle is in the c-axis direction from the M-plane.

10. The group III nitride semiconductor free-standing substrate according to claim 1, wherein the off-angle is in the a-axis direction from the M-plane.

11. The group III nitride semiconductor free-standing substrate according to claim 1, wherein the as-grown surface comprises a crystal surface in a state that a crystal is grown other than being subjected to a grinding and a polishing thereon.

* * * * *